(12) United States Patent
Su et al.

(10) Patent No.: US 11,462,441 B2
(45) Date of Patent: Oct. 4, 2022

(54) METHOD FOR FABRICATING SEMICONDUCTOR DEVICE

(71) Applicant: UNITED MICROELECTRONICS CORP., Hsin-Chu (TW)

(72) Inventors: Shih-Wei Su, Tainan (TW); Hao-Che Feng, Kaohsiung (TW); Hsuan-Tai Hsu, Tainan (TW); Chun-Yu Chen, Taichung (TW); Wei-Hao Huang, New Taipei (TW); Bin-Siang Tsai, Changhua County (TW); Ting-An Chien, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/147,477

(22) Filed: Jan. 13, 2021

(65) Prior Publication Data

US 2022/0189770 A1 Jun. 16, 2022

(30) Foreign Application Priority Data

Dec. 15, 2020 (CN) .......................... 202011477204.6

(51) Int. Cl.
*H01L 21/8234* (2006.01)
*H01L 21/762* (2006.01)
(Continued)

(52) U.S. Cl.
CPC .. *H01L 21/823431* (2013.01); *H01L 21/0243* (2013.01); *H01L 21/0245* (2013.01); *H01L 21/02507* (2013.01); *H01L 21/02532* (2013.01); *H01L 21/02639* (2013.01); *H01L 21/76224* (2013.01); *H01L 21/823481* (2013.01);
(Continued)

(58) Field of Classification Search
CPC ............ H01L 21/0243; H01L 21/0245; H01L 21/02507; H01L 21/02532; H01L 21/02603; H01L 21/02639; H01L 21/3065; H01L 21/76224; H01L 21/823412; H01L 21/823431; H01L 21/823481; H01L 21/823487; H01L 21/823807; H01L 21/823821; H01L 21/823878; H01L 29/0673; H01L 29/42392; H01L 29/66439; H01L 29/66742; H01L 29/66795; H01L 29/775; H01L 29/78; H01L 29/785; H01L 29/78696; B82Y 10/00; B82Y 40/00
See application file for complete search history.

(56) References Cited

U.S. PATENT DOCUMENTS

| 2013/0161756 | A1* | 6/2013 | Glass ................. H01L 27/1211 257/369 |
| 2014/0197377 | A1 | 7/2014 | Kim et al. |
| 2021/0408022 | A1* | 12/2021 | Young ............... H01L 29/66795 |

* cited by examiner

*Primary Examiner* — Cheung Lee
(74) *Attorney, Agent, or Firm* — Winston Hsu

(57) ABSTRACT

A method for fabricating a semiconductor device includes the steps of first forming a fin-shaped structure on a substrate, forming a dielectric layer surrounding the fin-shaped structure, performing an anneal process to transform the dielectric layer into a shallow trench isolation (STI), removing the fin-shaped structure to form a trench, and forming a stack structure in the trench. Preferably, the stack structure includes a first semiconductor layer on the fin-shaped structure and a second semiconductor layer on the first semiconductor layer and the first semiconductor layer and the second semiconductor layer include different materials.

10 Claims, 3 Drawing Sheets

(51) Int. Cl.
*H01L 21/02* (2006.01)
*H01L 29/66* (2006.01)
*H01L 29/786* (2006.01)
*H01L 29/775* (2006.01)
*H01L 29/06* (2006.01)
*H01L 21/3065* (2006.01)

(52) U.S. Cl.
CPC .. *H01L 29/66439* (2013.01); *H01L 29/66742* (2013.01); *H01L 21/3065* (2013.01); *H01L 29/0673* (2013.01); *H01L 29/775* (2013.01); *H01L 29/78696* (2013.01)

METHOD FOR FABRICATING SEMICONDUCTOR DEVICE

BACKGROUND OF THE INVENTION

1. Field of the Invention

The invention relates to a method for fabricating semiconductor device, and more particularly to a method of first forming shallow trench isolation (STI) and then forming semiconductor stack structure on top of fin-shaped structures.

2. Description of the Prior Art

In the past four decades, semiconductor industries keep downscaling the size of MOSFETs in order to achieve the goals of high operation speed and high device density. However, the reduction of device size won't last forever. When transistor shrink into or below 30 nm regime, leakage current due to severe short channel effects and thin gate dielectric causes the increase of off-state power consumption, and consequently causes functionality failure. One-dimensional devices based on nanowires or nanotubes are considered the immediate successors to replace the traditional silicon technology with relatively low technological risk. Nanowire transistor, which has higher carrier mobility and can be further enhanced by quantum confinement effect, is one of the most promising devices. In addition, the control of gate to channel can also be improved by using high-k dielectric layers.

SUMMARY OF THE INVENTION

According to an embodiment of the present invention, a method for fabricating a semiconductor device includes the steps of first forming a fin-shaped structure on a substrate, forming a dielectric layer surrounding the fin-shaped structure, performing an anneal process to transform the dielectric layer into a shallow trench isolation (STI), removing the fin-shaped structure to form a trench, and forming a stack structure in the trench. Preferably, the stack structure includes a first semiconductor layer on the fin-shaped structure and a second semiconductor layer on the first semiconductor layer and the first semiconductor layer and the second semiconductor layer include different materials.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
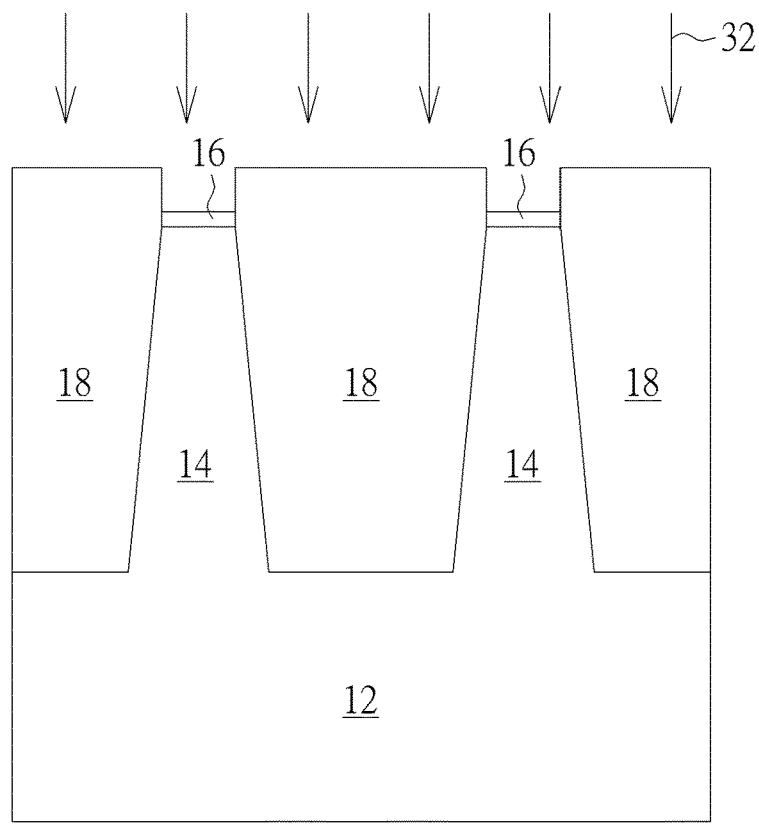
FIGS. 1-5 illustrate a method for fabricating a semiconductor device according to an embodiment of the present invention.

Referring to FIGS. 1-5, FIGS. 1-5 illustrate a method for fabricating a semiconductor device according to an embodiment of the present invention. As shown in FIG. 1, a substrate 12 such as a silicon substrate or silicon-on-insulator (SOI) substrate is first provided and at least a fin-shaped structure 14 is formed on the substrate. It should be noted that even though two fin-shaped structures 14 are formed on the substrate 12 in this embodiment, it would also be desirable to adjust the number of fin-shaped structures 14 depending on the demand of the product, which is also within the scope of the present invention.

Preferably, the fin-shaped structures 14 of this embodiment could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 14 could also be obtained by first forming a patterned mask (not shown) on the substrate, 12, and through an etching process, the pattern of the patterned mask is transferred to the substrate 12 to form the fin-shaped structures 14. Moreover, the formation of the fin-shaped structures 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 14. These approaches for forming fin-shaped structure are all within the scope of the present invention. It should be noted that after the fin-shaped structures 14 are formed, a selective liner 16 made of silicon oxide and another liner (not shown) made of silicon nitride could be formed on the surface of the fin-shaped structures 14.

Next, a shallow trench isolation (STI) 18 is formed around the fin-shaped structures 14. In this embodiment, the formation of the STI 18 could be accomplished by first conducting a flowable chemical vapor deposition (FCVD) process to form a dielectric layer made of silicon oxide on the substrate 12 and covering the fin-shaped structures 14 entirely, and then conducting an anneal process 32 by using a temperature at approximately 1000° C. to transform the dielectric layer into the STI 18. Next, the liner made of silicon nitride could be removed to expose the liner 16 made of silicon oxide and the top surface of the liner 16 is slightly lower than the top surface of the STI 18.

Figure 2:
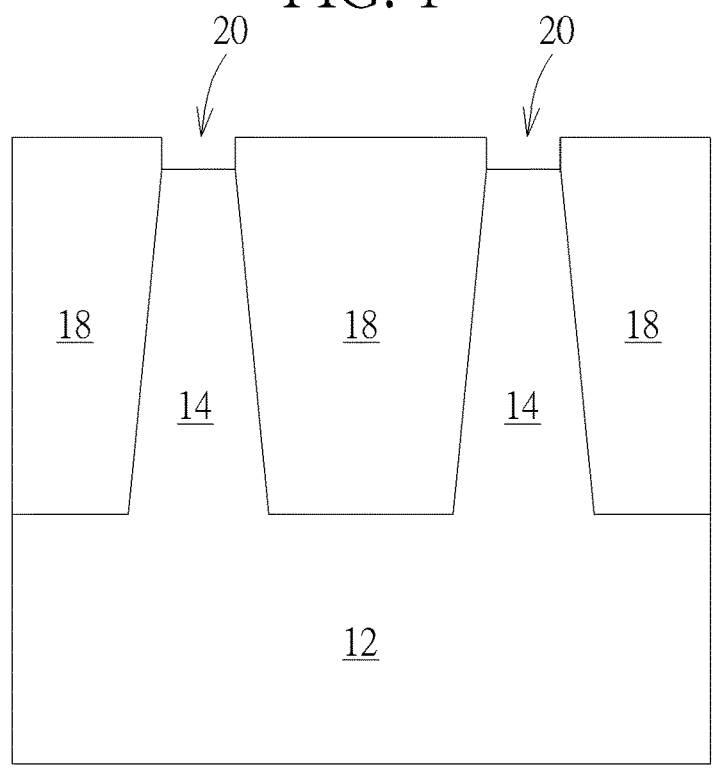

Next, as shown in FIG. 2, an etching process could be conducted by using nitrogen trifluoride ($NF_3$), ammonia gas ($NH_3$), and/or hydrofluoric acid (HF) without forming any patterned mask to remove the liner 16 on top of the fin-shaped structures 14 and at the same time form trenches 20 exposing the top surface of the fin-shaped structures 14. It should be noted that since the STI 18 around the fin-shaped structures 14 and the liner 16 are both made of silicon oxide, part of the surrounding STI 18 could also be removed when the etching process was conducted to remove the liner 16. As a result, the overall height of the STI 18 could be slightly reduced while the top surface of the STI 18 is still higher than the top surface of the fin-shaped structures 14.

Figure 3:
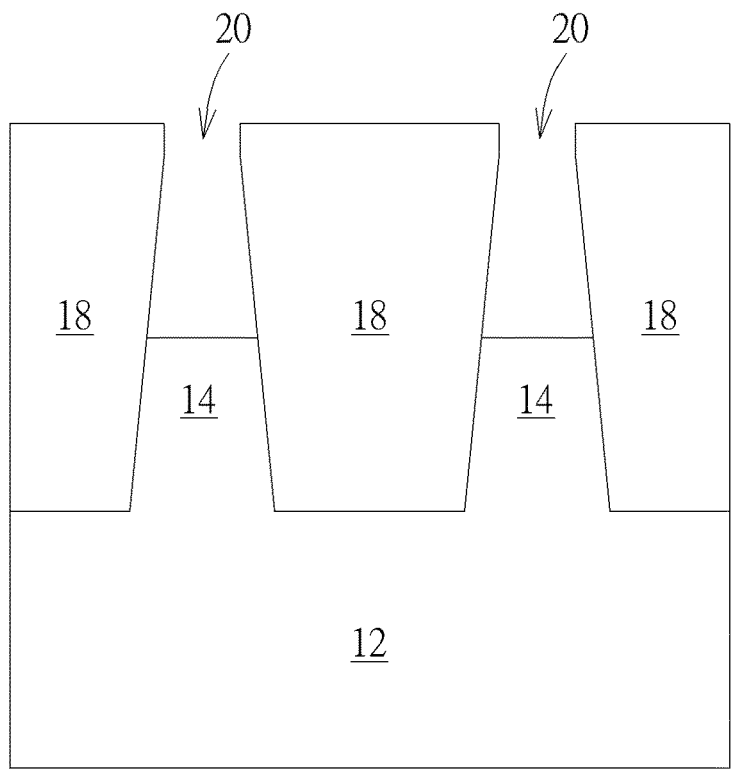

Next, as shown in FIG. 3, another etching process could be conducted by using hydrogen bromide (HBr) using or without using patterned hard mask to remove part of the fin-shaped structure 14 and increase the depth of the trenches 20 directly above the fin-shaped structures 14.

Figure 4:
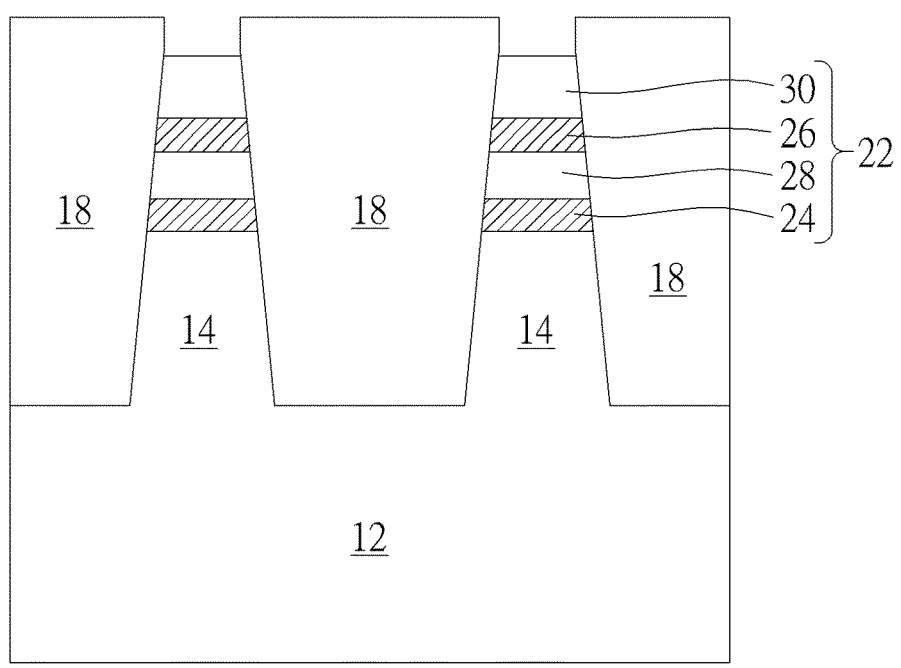

Next, as shown in FIG. 4, an epitaxial growth process is conducted to form a stack structure 22 in each of the trenches 20 on the top surface of the fin-shaped structures 14. Preferably, the stack structure 22 is made of at least two semiconductor layers made from different materials. For instance, the stack structure 22 in this embodiment includes a plurality of first semiconductor layers 24, 26 and a plurality of second semiconductor layers 28, 30 stacked according to an alternating manner one over another. Preferably, the first semiconductor layer 24 directly contacting the fin-shaped structures 14 and fin-shaped structures 14 are made of different materials, the first semiconductor layers 24, 26 are made of same material, the second semiconductor layers 28, 30 are made of same material, the first semiconductor layers 24, 26 and the second semiconductor layers 28, 30 are made of different materials or materials having different lattice constant, and the first semiconductor layers 24, 26 and second semiconductor layers 28, 30 could all be selected from the group consisting of silicon, silicon germanium, doped silicon, doped germanium, and/or silicon germanium.

For instance, the fin-shaped structures 14 and the second semiconductor layers 28, 30 could be made of silicon while the first semiconductor layers 24, 26 could be made of silicon germanium, or the fin-shaped structures 14 and the second semiconductor layers 28, 30 could be made of silicon germanium while the first semiconductor layers 24, 26 could be made of silicon. It should be noted that even though two first semiconductor layers 24, 26 and two second semiconductor layers 28, 30 stacked alternately to form the stack structure 22 are disclosed in this embodiment, according to other embodiment of the present invention it would also be desirable to adjust the number of the first semiconductor layers 24, 26 and the second semiconductor layers 28, 30 depending on the demand of the product, which is also within the scope of the present invention.

Figure 5:
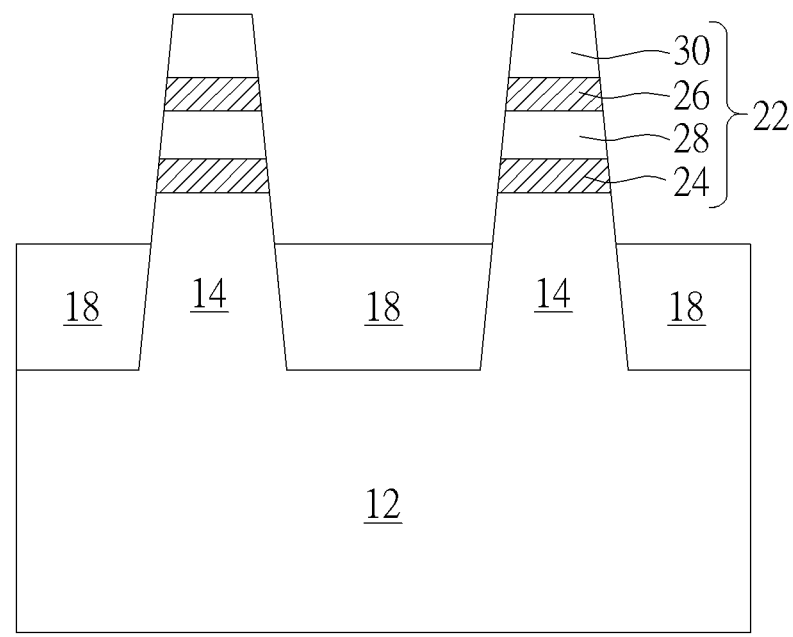

Next, as shown in FIG. 5, a chemical mechanical polishing (CMP) process and/or etching process could be conducted to remove part of the STI 18 so that the top surface of the remaining STI 18 is slightly lower than the top surface of the fin-shaped structures 14 or more specifically lower than the bottom surface of the first semiconductor layers 24 of the stack structure 22.

Figure 6:
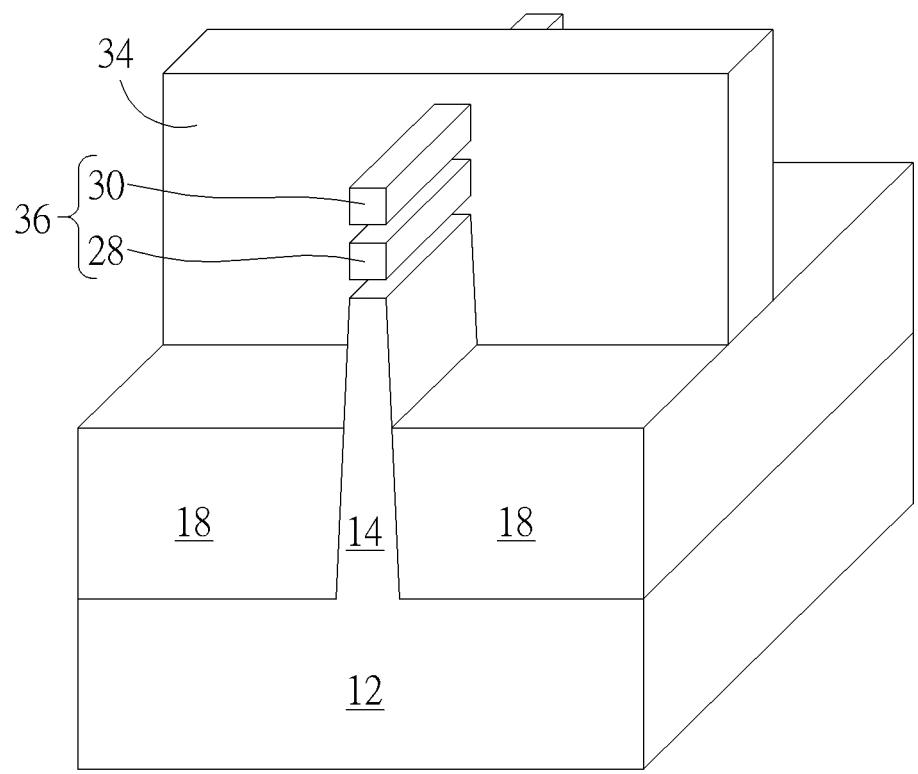
FIG. 6 illustrates a 3-dimensional view of a nanowire transistor according to an embodiment of the present invention.

Next, as shown in 3-dimensional view of FIG. 6, process for fabricating a nanowire transistor could be conducted thereafter by first forming a gate structure 34 made of polysilicon or metal standing astride the stack structure 22 and the fin-shaped structures 14, forming a spacer (not shown) adjacent to the gate structure 34, forming a source/drain structure (not shown) on the substrate 12 adjacent to two sides of the spacer, and then removing the odd number semiconductor layers or even number semiconductor layers such as the first semiconductor layers 24, 26 to form recesses as the remaining second semiconductor layers 28, 30 form nanowires 36. Since the fabrication of nanowire transistor is well known to those skilled in the art, the details of which are not explained herein for the sake of brevity. This completes the fabrication of a semiconductor device according to an embodiment of the present invention.

Typically, a stack structure made of aforementioned alternating semiconductor materials or layers are formed on a silicon substrate during formation of nanowire transistor, using a photo-etching process to remove part of the stack structure and part of silicon substrate to form patterned stack structures and fin-shaped structures, and then forming a STI around the fin-shaped structures. Nevertheless, anneal process conducted during formation of the STI easily induces germanium atoms to diffuse from the stack structure into surrounding silicon layers thereby affecting the quality of the fin-shaped structures and performance of the device. To resolve this issue, the present invention preferably moves the formation of the STI 18 (particularly the anneal process 32) shown in FIG. 1 before the formation of the stack structure 22 as shown in FIG. 4 so that germanium atoms would not diffuse into the surrounding fin-shaped structures 14 made of silicon as the stack structure is formed on top of the fin-shaped structure and performance of the device is ensured.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a fin-shaped structure on a substrate;
    forming a dielectric layer around the fin-shaped structure;
    performing an anneal process to transform the dielectric layer into a shallow trench isolation (STI);
    removing the fin-shaped structure to form a trench after performing the anneal process;
    forming a stack structure in the trench, wherein a top surface of the stack structure is lower than a top surface of the STI; and
    removing a portion of the STI after forming the stack structure, wherein a top surface of the STI is lower than a bottom surface of the stack structure.

2. The method of claim 1, further comprising:
    forming a gate structure on the stack structure.

3. The method of claim 1, wherein the stack structure comprises:
    a first semiconductor layer on the fin-shaped structure; and
    a second semiconductor layer on the first semiconductor layer.

4. The method of claim 3, wherein the first semiconductor layer and the second semiconductor layer comprise different materials.

5. The method of claim 3, wherein the first semiconductor layer and the fin-shaped structure comprise different materials.

6. The method of claim 3, wherein the first semiconductor layer and the second semiconductor layer are selected from the group consisting of silicon and silicon germanium.

7. The method of claim 3, wherein the stack structure comprises:
    a third semiconductor layer on the second semiconductor layer; and
    a fourth semiconductor layer on the third semiconductor layer.

8. The method of claim 7, wherein the third semiconductor layer and the fourth semiconductor layer comprise different materials.

9. The method of claim 7, wherein the third semiconductor layer and the second semiconductor layer comprise different materials.

10. The method of claim 7, wherein the third semiconductor layer and the fourth semiconductor layer are selected from the group consisting of silicon and silicon germanium.

* * * * *